United States Patent [19]

Wood

[11] Patent Number: 4,511,815
[45] Date of Patent: Apr. 16, 1985

[54] TRANSFORMER-ISOLATED POWER MOSFET DRIVER CIRCUIT

[75] Inventor: Peter N. Wood, Los Angeles, Calif.

[73] Assignee: International Rectifier Corporation, Los Angeles, Calif.

[21] Appl. No.: 523,121

[22] Filed: Aug. 15, 1983

[51] Int. Cl.³ .................. H03K 17/687; H03K 17/04; H03K 17/60; H03K 17/68
[52] U.S. Cl. .................................. 307/584; 307/246; 307/279; 307/282
[58] Field of Search ............... 307/571, 572, 574, 575, 307/577, 581, 584, 270, 246, 412

[56] References Cited

U.S. PATENT DOCUMENTS 4,052,623 10/1977 Loberg ................................ 307/251
4,423,341 12/1983 Shelly ................................. 307/570

FOREIGN PATENT DOCUMENTS 158849 12/1979 Japan ................................. 307/270
0921090 4/1982 U.S.S.R. ............................ 307/571

Primary Examiner—Stanley D. Miller
Assistant Examiner—Richard Roseen
Attorney, Agent, or Firm—Ostrolenk, Faber, Gerb & Soffen

[57] ABSTRACT

A high power MOSFET switching circuit which has a larger duty cycle is driven from the output winding of a saturable isolation transformer. The output winding is coupled to the gate of the MOSFET power switch through a series connected control MOSFET device having an inherent parallel-connected diode. The gate capacitance is charged through the diode and is discharged through the control MOSFET when it is turned on. The drive circuit is a low impedance circuit with full isolation between input and output terminals.

8 Claims, 9 Drawing Figures

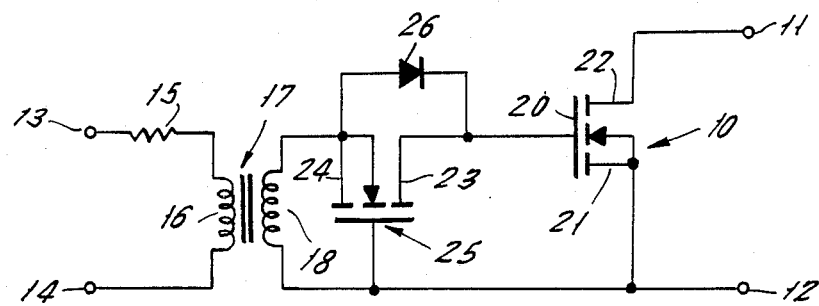
FIG. 1.
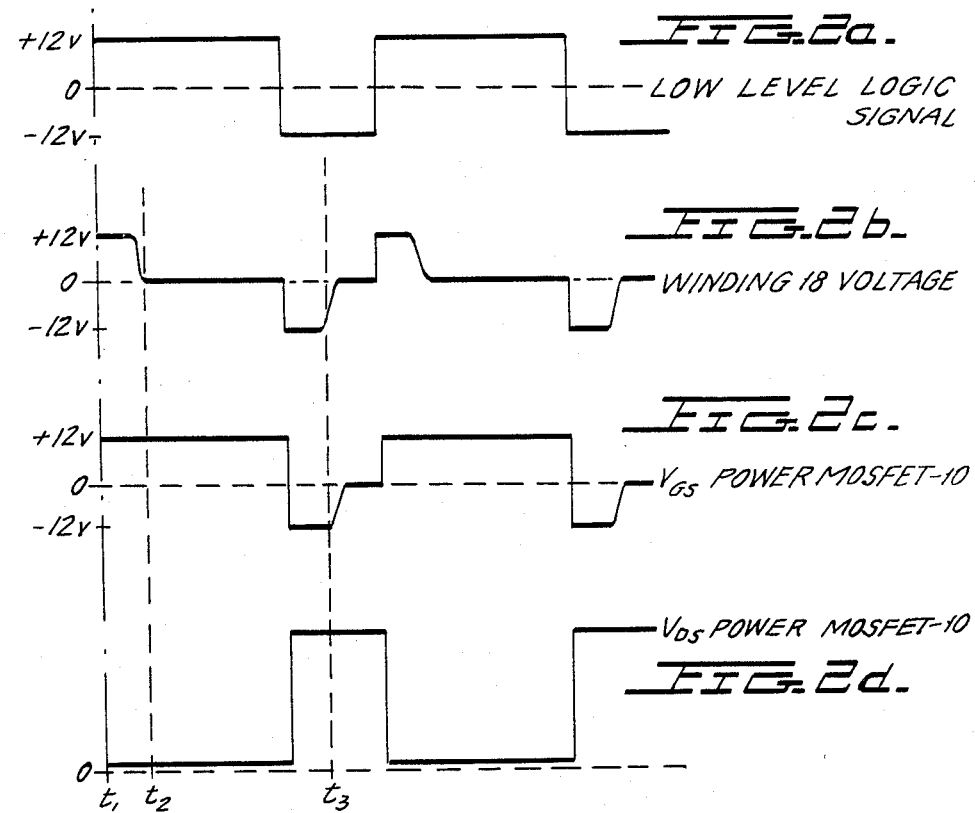
FIG. 2a. — LOW LEVEL LOGIC SIGNAL
FIG. 2b. — WINDING 18 VOLTAGE
FIG. 2c. — $V_{GS}$ POWER MOSFET-10
FIG. 2d. — $V_{DS}$ POWER MOSFET-10

4,511,815

TRANSFORMER-ISOLATED POWER MOSFET DRIVER CIRCUIT

BACKGROUND OF THE INVENTION

This invention relates to drive circuits for power MOSFET switching devices and more specifically relates to a novel transformer isolated driver circuit which permits the use of very large duty cycle ratios.

Transformer coupling of low level signals to semiconductor power switching devices offers several advantages such as impedance matching, d-c isolation and step-up or step-down capability. Transformers, however, can deliver only a-c signals since the core flux must be reset each half cycle. A constant number of volt seconds must be reset in both positive and negative half cycles so that very large voltage swings occur in the output winding of the isolation transformer if a large duty cycle is required. That is, if there is a very narrow reset pulse, the voltage induced in the output winding is extremely high in order to produce the necessary volt second area required for resetting the transformer flux. This would exceed the relatively sensitive voltage limitations of a power MOSFET device. Therefore, transformers in semi-conductor drive circuits are usually limited to a 50% duty cycle so that roughly equal pulse widths are used for the positive and negative half cycles.

Thus, when large duty cycle ratios have been needed for a semi-conductor power switch, it is common to employ optical coupling between the input and output signals to provide the necessary drive isolation. Optical couplers, however, have poor noise immunity and a high impedance output. Moreover, they require additional floating power sources which add complexity to the driver circuit. When the power semi-conductor being driven is a power MOSFET device such as the HEXFET power MOSFET device sold by the International Rectifier Corporation of El Segundo, Calif., the high output impedance of the optical coupler is not a serious problem because the HEXFET power MOSFET does not require drive current in the on or off state. However, even in such power MOSFET devices, switching speed will be seriously compromised if a high impedance driver is used.

BRIEF DESCRIPTION OF THE INVENTION

In accordance with the present invention, a novel driver circuit is provided for power transistor devices which employs transformer isolation between the input and output circuits and has a relatively low input impedance to the power device while still substantially limiting the peak voltage which can be applied to the gate of the power MOSFET device. More specifically, in accordance with the invention, the output winding of the isolation transformer is connected in series with the source and drain electrodes of a relatively lower power MOSFET device which has either an inherent diode or an added diode in parallel with its source and drain electrodes. The source-to-drain circuit of this auxiliary MOSFET device is then connected to the gate circuit of the power MOSFET device which is the power switch to be driven. The low level logic signal applied to the input winding of the transformer is arranged relative to the transformer such that the transformer will saturate before the end of the logic signal. Consequently, when the signal is turned on and an output voltage is induced across the output winding of the isolation transformer, current can flow through the diode associated with the auxiliary MOSFET in order to charge the gate to substrate capacitance of the main power switch and thus turn on the switch. This occurs extremely rapidly because the charging circuit has a relatively low impedance. When the transformer saturates, the gate capacitance of the main power switch cannot discharge through the auxiliary diode since this diode is now back-biased so that the power switch stays on. However, once the low level logic signal applied to the transformer input winding is reversed, the auxiliary MOSFET is turned on, thus producing a relatively low impedance discharge path in parallel with the auxiliary diode, to discharge the gate capacitance of the main power switch. Consequently, turn-off occurs rapidly due to the relatively low impedance circuit produced when the auxiliary MOSFET is turned on.

BRIEF DESCRIPTION OF THE DRAWINGS

FIG. 1 is a circuit diagram of the novel driver circuit of the present invention.

FIG. 2a shows the wave form of the low level logic signal input to the isolation transformer.

FIG. 2b shows the output voltage of the transformer output winding in FIG. 1.

FIG. 2c shows the gate-to-source voltage of the power MOSFET device of FIG. 1.

FIG. 2d shows the drain-to-source voltage of the power MOSFET device of FIG. 1.

DETAILED DESCRIPTION OF THE INVENTION

Figure 3:
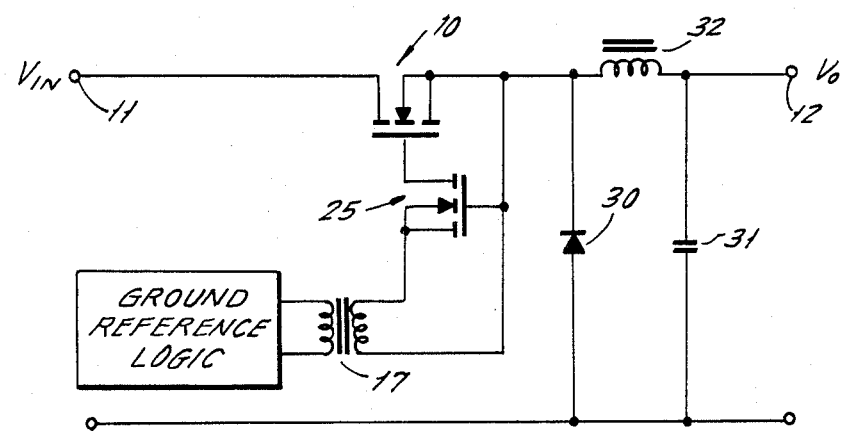
FIG. 3 is a circuit diagram showing the circuit of the present invention used in a single switch regulator.

Referring first to FIG. 1, there is shown therein a circuit diagram in which a metal oxide semiconductor field effect transistor (MOSFET) power switching device 10 is connected between main power terminals 11 and 12 and is to be turned on and off by the novel driver circuit of the invention. Preferably, switch 10 is a vertically conducting power MOSFET device such as the HEXFET power MOSFET device manufactured by the International Rectifier Corporation of El Segundo, Calif.

The power MOSFET device 10 is switched on and off in response to a signal applied to the input terminals 13 and 14 of the driver circuit. The signal voltage applied to these terminals is connected in series with a relatively small resistor 15 and the input winding 16 of a transformer 17 which has an output winding 18. Transformer 17 has a saturable ferromagnetic core with separate windings 16 and 18 wound on the common core and electrically isolated from one another. The winding ratio between windings 16 and 18 may be 1:1.

Power MOSFET 10 has a gate terminal 20 and source and drain electrodes 21 and 22, respectively. The gate-to-source circuit of the power MOSFET 10 is connected in series with the drain and source electrodes 23 and 24 of MOSFET 25.

MOSFET 25 is preferably a relatively low power MOSFET of vertical conduction type which has an integral diode 26 associated therewith. For example, MOSFET 25 can be a type IRFD1Z1 HEXFET MOSFET manufactured by the International Rectifier Corporation.

The operation of the circuit of FIG. 1 is now described with reference to FIGS. 2a through 2d which show voltages in various parts of the circuit on a common time base. As will be described, the circuit of FIG. 1 provides low impedance switching for the power MOSFET 10 during the switching intervals and permits a duty cycle ratio of 1% to 99%. Moreover, the circuit can have any desired voltage ratio and provides high dielectric isolation between the input and output circuits. The circuit being controlled at terminals 11 and 12 can be any desired circuit such as a switching power supply, motor drive or the like requiring isolation between the low level logic input at terminals 12 and 13 (FIG. 2a) and the high power output at terminals 11 and 12.

When a typical low level logic signal, shown in FIG. 2a, is applied to terminals 13 and 14 at time $t_1$, a voltage is induced into winding 18 and is supported by the changing core flux until saturation occurs, as shown in FIG. 2b at time $t_2$. At time $t_2$, the winding 18 voltage falls to zero and remains at zero until the core flux is reversed by the negative going portion of the low level logic signal of FIG. 2a. Saturation will again occur at time $t_3$ when the negative applied pulse exceeds the volt second capability of the core.

During the positive portion of the wave form of secondary winding 18, which, of course, has the same form as the primary, the intrinsic diode 17 of control MOSFET device 25 is biased into forward conduction. Thus, the gate capacitance of gate 20 of the main power switch 10 is charged from a source having an impedance equal to the sum of the resistance of resistor 15 and forward impedance of the intrinsic diode 26. In a practical circuit this would be less than about 10 ohms. Therefore, the device 10 will turn on in about 75 nanoseconds at the time $t_1$.

Once the transformer 17 saturates, the intrinsic diode 26 isolates the collapse of the voltage of winding 18 from the gate 20 of the power MOSFET 10. Therefore, the input gate capacitance of the MOSFET 10 remains charged and holds the gate biased in a fully enhanced condition for a time limited only by the gate leakage current of power MOSFET 10 as shown, for example, in FIG. 2c.

Once the wave form of FIG. 2a goes 12 volts negative, transistor 25 becomes fully enhanced so that the gate to substrate capacitance of main power switch device 10 can now discharge through the source-to-drain circuit of the auxiliary or control MOSFET 25. This circuit will have a source impedance equal to the resistance of resistor 15 plus the source-to-drain resistance of device 25. This total resistance will be less than about 10 ohms and yields a turn-off time for device 10 of less than about 100 nanoseconds.

When the transformer 17 again saturates during the negative half cycle, its winding voltages will fall to zero and transistor 25 will remain off. As the transformer voltage collapses, the gate of transistor 10 will follow the collapsing voltage and remain at zero bias.

The drain voltage of power MOSFET switch 10 is shown in FIG. 2d and it will be seen that this voltage is a mirror image of the wave form of the low level logic signal of FIG. 2a. Note that because the transformer 17 need only support a relatively low signal voltage, for example, 12 volts for one microsecond or less, the transformer 17 is extremely small and inexpensive.

The novel driver circuit of the invention can be employed in many different types of circuits, particularly those in which power MOSFET devices replace bipolar transistors and an insignificant gate current is required to achieve full conduction and is so small that the on or off bias levels can be stored in the gate-to-source capacitance.

FIG. 3 shows the manner in which the novel driver circuit of the invention can be used in a single switch regulator. In FIG. 3, components identical to those of FIG. 1 have been given the same identifying numerals. Thus, the main power device 10 is connected between the input and output terminals 11 and 12 but a diode 30, capacitor 31 and inductor 32 are added to the circuit.

Figure 4:
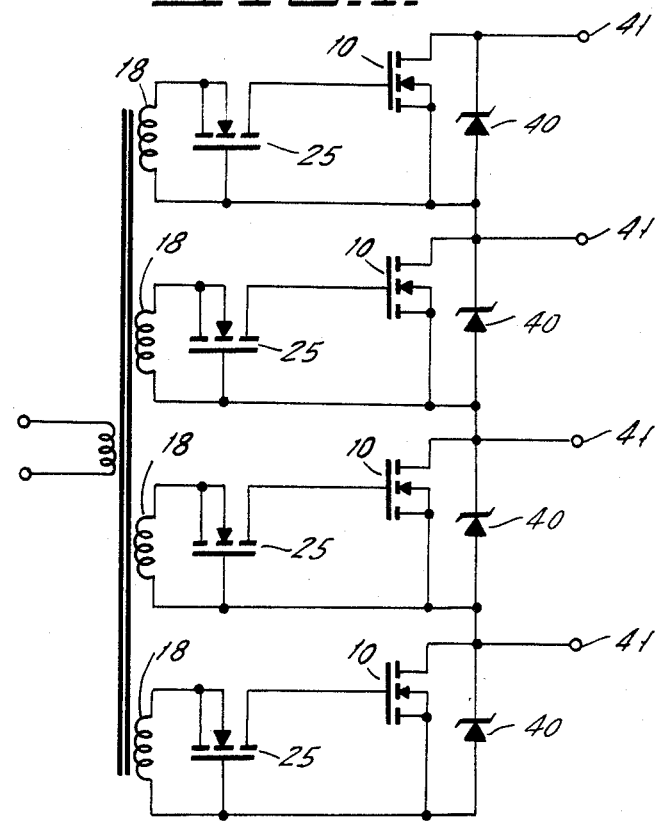
FIG. 4 is a circuit diagram showing the circuit of the present invention with a high power switch device.

In the circuit of FIG. 4, identical driver circuits are employed in a high power MOSFET switching device rated at 500 volts and 8 amperes for each of four individual sections. Each of the power MOSFETs 10 may be HEXFET MOSFETs type IRF840 in the circuit of FIG. 4. Each of the source-to-drain circuits of MOSFETs 10 is provided with an avalanche diode 40 connected as shown with each circuit having an output terminal 41 as shown.

Figure 5:
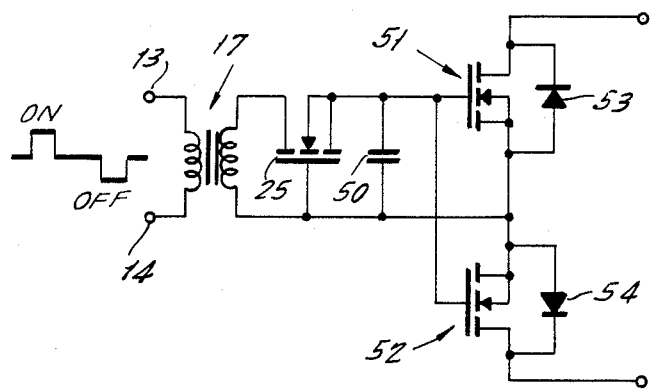
FIG. 5 is a circuit diagram showing the circuit of the present invention applied to a bi-directional a-c switch.

FIG. 5 illustrates the novel driver circuit of the invention used for a bidirectional a-c switch. Thus, in FIG. 5, the input signal shown to the left of terminals 13 and 14 includes a positive going pulse for turning on the switch and a negative going pulse for turning off the switch. An additional capacitance 50 is added to the circuit to enable long switching periods. Two anti-parallel connected power MOSFET devices 51 and 52 are employed in place of the single power MOSFET 10 of FIG. 1. Note that each of MOSFETs 51 and 52 have intrinsic diodes 53 and 54, respectively, associated therewith. Each of the power MOSFETs 51 and 52 may be type IRF840 HEXFET MOSFETs.

Figure 6:
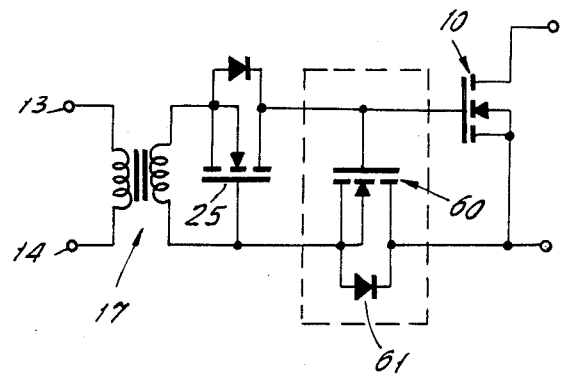
FIG. 6 is a circuit diagram of another embodiment of the novel driver circuit of the invention, modified to have additional noise immunity.

FIG. 6 shows a further embodiment of the present invention wherein the driver circuit is provided with additional noise immunity. Thus, as seen in FIG. 2b, the gate-to-source voltage of transistor 10 in the off state will return to zero when transformer 17 saturates at time $t_2$. For most applications, the noise immunity provided by the threshold voltage of transistor 10 is sufficient since the threshold voltage will be between 2 and 4 volts. In applications where more noise immunity is needed, an additional N channel control MOSFET device 60 having an intrinsic diode 61 can be added to the circuit as shown in FIG. 6. The circuit then provides about 14 volts noise immunity for MOSFET 10 which is adequate for most applications.

Although the present invention has been described in connection with a number of preferred embodiments thereof, many other variations and modifications will now become apparent to those skilled in the art. It is preferred, therefore, that the present invention be limited not by the specific disclosure herein, but only by the appended claims.

What is claimed is:

1. A driver circuit for an output metal oxide field effect transistor; said output metal oxide field effect transistor having gate, source and drain electrodes; said driver circuit comprising an isolation transformer having magnetically coupled input winding means and output winding means which are dielectrically isolated from one another, a control metal oxide field effect transistor having gate, source and drain electrodes, and diode means connected across said source and drain electrodes of said control transistor; said output winding means; said source and drain electrodes of said control transistor and said gate and source electrodes of said output transistor connected in a closed series circuit; said output winding means, said gate electrode of said control transistor and said source electrode of said control transistor connected in a closed series circuit; said diode means having a conduction direction to permit charging of the inherent gate capacitance of said output transistor when said output winding means has an output voltage thereon of a first polarity, and to oppose the discharge of said gate capacitance when said output voltage of said output winding means is zero or reverses from said first polarity.

2. The circuit of claim 1, wherein said diode means is an integral component of said control transistor.

3. The circuit of claim 2, wherein said control transistor and said output transistor are vertical conduction power transistors.

4. The circuit of claim 1, 2 or 3 which further includes an input a-c control circuit connected to said input winding means.

5. The circuit of claim 4, wherein said input a-c control circuit has a variable duty cycle.

6. The circuit of claim 5, wherein said isolation transformer contains a core which is saturated each half cycle of said input a-c control circuit.

7. The circuit of claim 1 which further includes a noise immunity metal oxide field effect transistor having gate, source and drain electrodes, and a noise immunity diode means; said source and drain electrodes of said noise immunity transistor connected in series with the source and drain electrodes of said output transistor and of said control transistor; said gate electrode of said noise immunity transistor connected to said gate electrode of said output transistor said noise immunity diode means connected in parallel with said source and drain electrodes of said noise immunity transistor and having a polarity in opposition to the polarity of said diode means of claim 1.

8. The circuit of claim 7, wherein said noise immunity diode means is an integral component of said noise immunity transistor.

* * * * *